United States Patent
Pillai et al.

(10) Patent No.: US 7,265,433 B2
(45) Date of Patent: Sep. 4, 2007

(54) ON-PAD BROADBAND MATCHING NETWORK

(75) Inventors: Edward R. Pillai, Wappingers Falls, NY (US); Louis L. Hsu, Fishkill, NY (US); Wolfgang Sauter, Richmond, VT (US); Daniel W. Storaska, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,624

(22) Filed: Jan. 13, 2005

(65) Prior Publication Data

US 2006/0151851 A1    Jul. 13, 2006

(51) Int. Cl.
*H02H 3/22* (2006.01)
(52) U.S. Cl. .............................. 257/531; 257/E21.575
(58) Field of Classification Search ................ 257/531, 257/E21.575
See application file for complete search history.

(56) References Cited

U.S. PATENT DOCUMENTS

| | | | |
|---|---|---|---|
| 6,433,985 B1* | 8/2002 | Voldman et al. ............ | 361/113 |
| 2003/0122620 A1* | 7/2003 | Burns et al. ................. | 330/129 |
| 2004/0089951 A1* | 5/2004 | Lin ............................. | 257/773 |

OTHER PUBLICATIONS

L. Selmi et al., "Small-Signal MMIC Amplifiers with Bridged T-Coil Matching Networks," *IEEE Journal of Solid-State Circuits*, vol. 27, No. 7, Jul. 1992, pp. 1093-1096.

J.Y.C. Chang et al., "Large Suspended Inductors on Silicon and Their Use in a 2 μm CMOS RF Amplifier," *IEEE Electron Device Lett.*, vol. 14, May 1993, pp. 246-248.

R.C. Frye, "Integration and Electrical Isolation in CMOS Mixed Signal Wireless Chips," *Proc. of IEEE*, vol. 89, No. 4, Apr. 2001, pp. 444-455.

C.P. Yue et al., "On-chip Spiral Inductors with Patterned Ground Shields for Si-Based RF IC's," *IEEE Journal of Solid State Circuits*, vol. 33, No. 5, May 1998, pp. 743-752.

S. Lam et al., "High-Isolation Bonding Pad with Depletion-Insulation Structure for RF/Microwave Integrated Circuit on Bulk Silicon CMOS," *2002 IEEE MTT-S Digest*, pp. 677-680.

H.G. Feng et al., "Circular Under-Pad Multiple-mode ESD Protection Structure for ICs," *Electronics Letters*, May 23, 2002, vol. 38, No. 11, p. 511-513.

\* cited by examiner

*Primary Examiner*—Thomas L. Dickey
(74) *Attorney, Agent, or Firm*—Steven Capella; Daryl Neff

(57) ABSTRACT

A chip is provided in which an on-chip matching network has a first terminal conductively connected to a bond pad of the chip and a second terminal conductively connected to a common node on the chip. A wiring trace connects the on-chip matching network to a circuit of the chip. The on-chip matching network includes an electrostatic discharge protection (ESD) circuit having at least one diode having a first terminal conductively connected to the bond pad and a second terminal connected in an overvoltage discharge path to a source of fixed potential. The matching network further includes a first inductor coupled to provide a first inductive path between the bond pad and the wiring trace, a termination resistor having a first terminal connected to the common node, and a second inductor coupled to provide a second inductive path between the wiring trace and a second terminal of the termination resistor.

17 Claims, 8 Drawing Sheets

FIG. 1
(PRIOR ART)
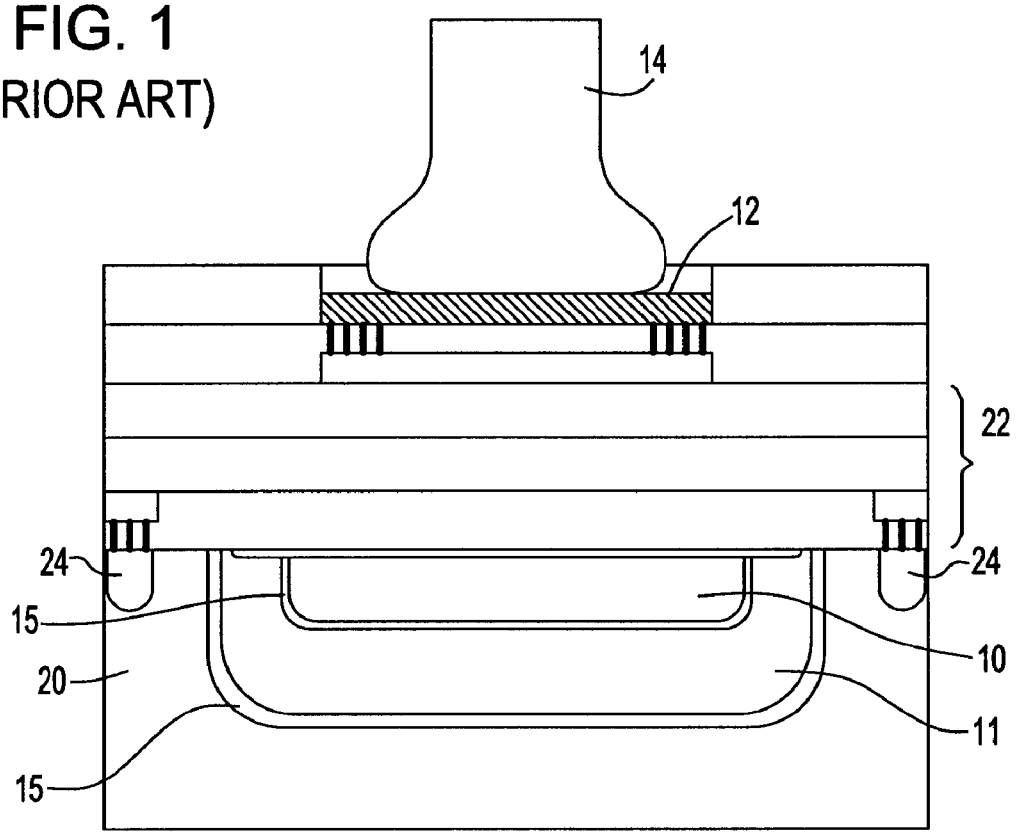
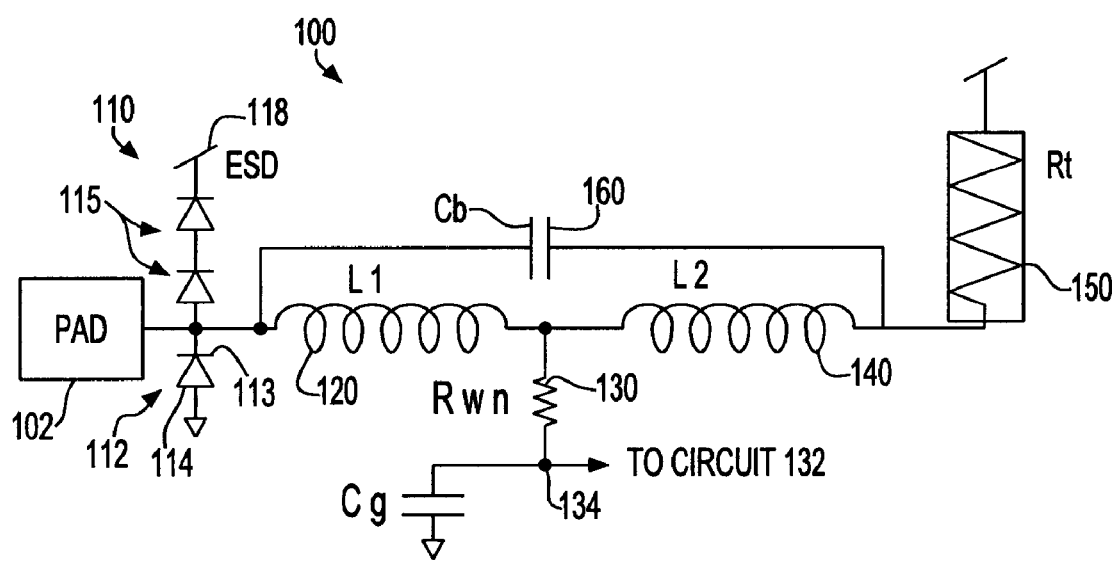
FIG. 2

US 7,265,433 B2

ON-PAD BROADBAND MATCHING NETWORK

BACKGROUND OF THE INVENTION

The present invention relates to semiconductor integrated circuits, and more particularly to a matching network connected to a bond pad of a chip.

Signal return loss is a problem that occurs at the interface between a chip containing an integrated circuit (hereinafter, a "chip") and a package to which it is mounted. Such loss can be substantial for radio frequency signals as the frequency of the signals increase. However, the connection of an appropriate matching network to bond pads of the chip, such as to C4 ("controlled collapse chip connection") type bond pads can address the problem. The difficulty then becomes the construction of an appropriate matching network.

Such matching networks typically include passive devices such as inductors and capacitors having sizes that are sometimes close to that of the bond pads. For example, a bridged T-Coil matching network described in the article by L. Selmi et al., entitled "Small-Signal MMIC Amplifiers with Bridged T-Coil Matching Networks," *IEEE Journal of Solid-State Circuits*, Vol. 27, No. 7, July 1992, pp. 1093-1096, includes a pair of series-connected inductors. A T-coil provides a two-pole matching characteristic. With a matching network having a properly selected coil size, a high reactive impedance that would otherwise be present at the input gate of a signal receiver can be transformed to a constant, real 50 ohm termination resistance.

By integrating digital and analog circuits on the same semiconductor chip, especially a silicon chip, noise generated by digital circuits having large swing signals, e.g., rail-to-rail swing signals, is easily coupled into more sensitive analog circuits. The impact is felt especially for analog circuits which receive or output reduced swing signals, i.e., those which do not swing from rail to rail. In addition, as discussed in the article by R. C. Frye entitled "Integration and Electrical Isolation in CMOS Mixed Signal Wireless Chips," *Proc. of IEEE*, vol. 89, No. 4, April 2001, pp. 444-455, there is an inherent conflict between the design factors involved in fabricating high quality factor (hereinafter, "Q") passive components, and the design factors involved in providing robust electrical isolation for high Q components.

To increase the Q of an inductor, design considerations prefer the inductor to be disposed over a thick cavity area. However, a thick cavity area may not be possible in view of a particular structure required to avoid a circuit problem known as latch-up. For that purpose, the wafer structure usually includes a thin (i.e., having a few microns thickness) resistive epitaxial layer grown on top of a ground plate formed by a high conductivity bulk substrate region. In such case, the epitaxial layer is too thin to permit a high Q factor to be achieved for an on-chip inductor. However, unfortunately, the epitaxial layer cannot be simply thickened, because it will result in poorer electromagnetic isolation.

The article by J. Y. C. Chang et al. entitled "Large Suspended Inductors On Silicon and Their Use in a 2 μm CMOS RF Amplifier," *IEEE Electron Device Lett.*, Vol. 14, May 1993, pp. 146-248 proposed to improve the Q of the inductor by etching the bulk layer from underneath the inductor. However, the process disclosed therein is complex, and may fall short in terms of long-term reliability. Another proposed method of improving the Q of an on-chip spiral inductor includes a patterned ground shield, as described in the article by C. P. Yue et al. entitled "On-chip Spiral Inductors with Patterned Ground Shields for Si-Based RF IC's," *IEEE Journal of Solid State Circuits*, Vol. 33, No. 5, May 1998, pp. 743-752. It was noted such ground shield can not effectively improve the Q due to the increased parasitic capacitance of such ground shield.

In addition, a method proposed to improve the isolation of a wire bonding pad is described in the article by S. Lam et al., entitled "High-isolation Bonding Pad with Depletion-insulation Structure for RF/Microwave Integrated Circuit on Bulk Silicon CMOS," 2002 *IEEE MTT-S Digest*, pp. 677-680. Here, as illustrated in the prior art FIG. 1, a p-type semiconductor diffusion region 10 is disposed inside an n-type well 11 provided in the semiconductor region 20 under the bond pad 12, in order to form depletion regions 15 for reducing the parasitic capacitance between the pad and the bulk region of the substrate, to reduce loss at the interface to the substrate. To further decrease the loss, that article also proposes that insulating oxide layers 22 be provided on top of the depletion structure underlying the bond pad 12. The structure is shown having a bond wire 14 bonded to the bond pad 12, and having a bulk region 20 of the substrate grounded through substrate contacts 24.

It is known to place circuit elements such as electro-static discharge protection (ESD) devices underneath a bond pad of a chip, as described in the article by H. G. Feng et al., entitled "Circular Under-Pad Multiple-mode ESD Protection Structure for ICs," *Electronics Letters*, 23 May 2002, Vol. 38, No. 11, p. 511-513. Other discrete devices such as decoupling capacitors can also be placed underneath the pad. Technically, there is no reliability concern to place such devices under C4 type bond pads, since C4 bond pads are formed and interconnected to the package by processing involving relatively low physical force.

In view of the foregoing, it is seen that the state of the art regarding the design of an on-chip matching network depends upon the component values of reactive passive components such as inductors and the Q factors that can be achieved. The size of a reactive passive component such as an inductor is mainly determined by the inductor's component value. Such components scale inversely with frequency, i.e., the required component size can be made smaller as the signal frequency is increased. However, as a practical matter, the fabrication of on-chip inductor components must still conform to basic constraints. The linewidth of conductors used in such inductors varies little from one generation to the next. Accordingly, the overall dimensions of the inductor may either stay the same or decrease from one generation to the next. This is a major reason why the size of RF analog chips remains nearly constant despite new generations of transistor technology which enable operation at higher frequencies. The motivation of mixing analog circuits with digital circuits is to cut down the overall integration cost. Ultimately, the successfulness of mixed signal ICs depends on the ability to reduce the overall chip size. For that reason, there is a current need to pack large-sized analog components into a small chip area without jeopardizing the quality factor of the discrete analog components, while also avoiding high substrate loss. A second need exists to address the effect of semiconductor substrate loss on the effectiveness of T-coils as inductive components of a matching network.

SUMMARY OF THE INVENTION

According to one aspect of the invention, a chip is provided in which an on-chip matching network has a first terminal conductively connected to a bond pad of the chip and a second terminal conductively connected to a common node on the chip. A wiring trace connects the on-chip matching network to a circuit of the chip. The on-chip matching network includes an electrostatic discharge protection (ESD) circuit having at least one diode having a first terminal conductively connected to the bond pad and a second terminal connected in an overvoltage discharge path to a source of fixed potential. The matching network further includes a first inductor coupled to provide a first inductive path between the bond pad and the wiring trace, a termination resistor having a first terminal connected to the common node, and a second inductor coupled to provide a second inductive path between the wiring trace and a second terminal of the termination resistor.

BRIEF DESCRIPTION OF THE DRAWINGS

FIG. 1 is a sectional view illustrating an under pad ESD structure according to the prior art.

FIG. 2 is a circuit diagram illustrating an on-chip matching network according to an embodiment of the invention.

DETAILED DESCRIPTION

Figure 3:
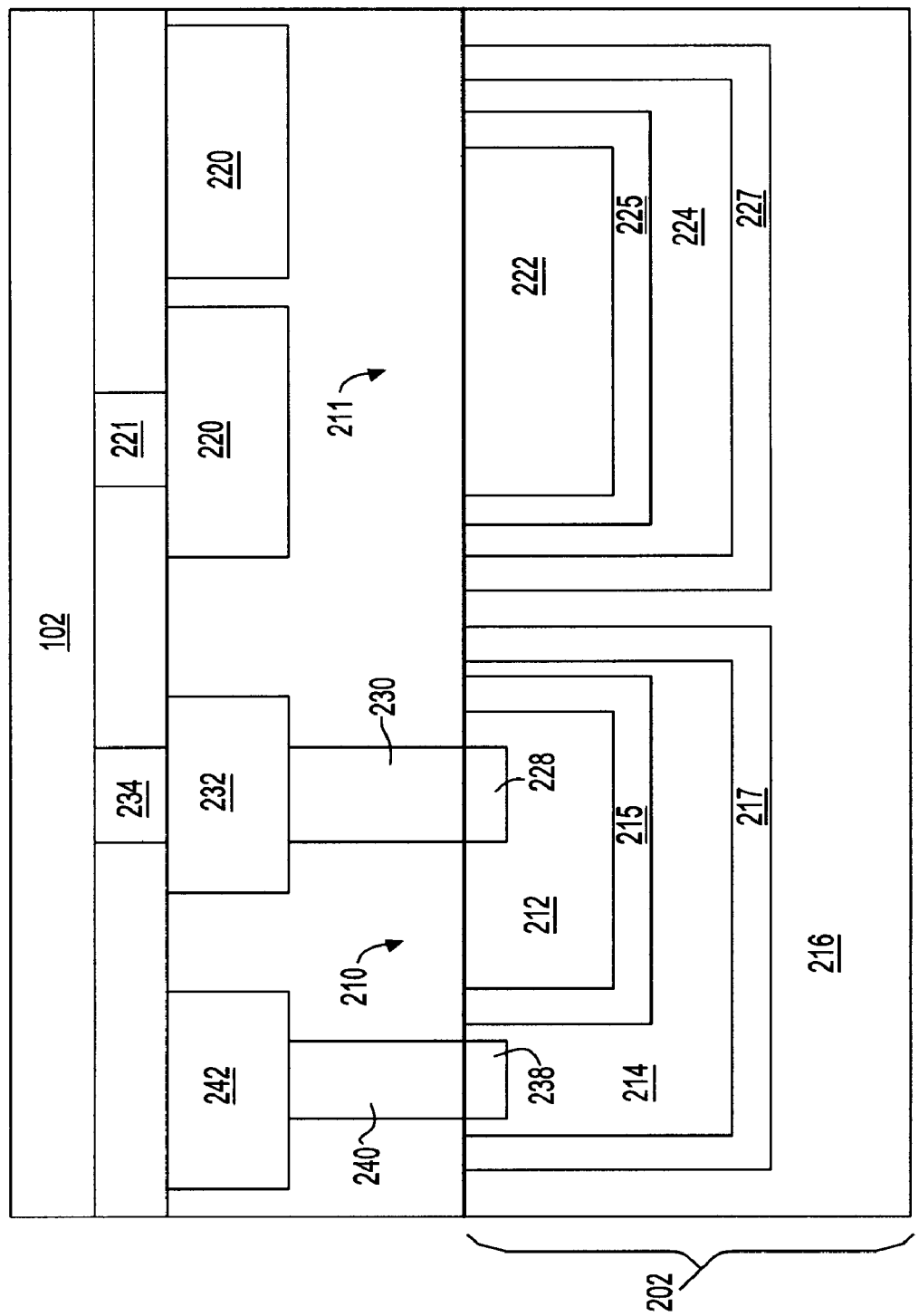
FIG. 3 is a sectional view illustrating a structure of an on-chip matching network according to the embodiment of the invention illustrated in FIG. 2.

FIG. 2 illustrates an on-chip matching network 100 and its interconnection to a bond pad 102, in accordance with an embodiment of the invention. As shown therein, the on-chip matching network 100 includes an electrostatic discharge protection (ESD) circuit 110 conductively connected to the bond pad 102, a wiring trace 130 connecting the on-chip matching network 100 to a circuit 132 of the chip. The on-chip matching network includes a first inductor 120 having an inductance L1, conductively connected to the bond pad and providing a inductive path between the bond pad 102 and the wiring trace 130, a second inductor 140 of value L2, having one terminal conductively connected to the wiring trace 130 and providing an inductive path between the wiring trace 130 and a termination resistor 150 at another terminal of the inductor 140. The connection of the wiring trace 130 to the on-chip circuit 132 between the first and second inductors 120, 140 is characteristic of known "T-coil" arrangements. The termination resistor 150 provides a resistive path between the second inductor 140 and a voltage source, i.e., a power supply voltage. Reference numeral 160 denotes a parasitic capacitance having value Cb, such capacitance being engendered by the relative placement and interaction between the two on-chip inductors 120 and 140.

In the embodiment illustrated in FIG. 2, the ESD circuit is connected to the bond pad 102 in a manner which is not intuitive. By conductively connecting the ESD circuit directly to the bond pad 102, the impedance of the ESD circuit is not compensated by the T-coil formed by inductors 120, 140 and wiring trace 130. However, several benefits are achieved by the on-chip matching network illustrated in FIG. 2. The conductive connection of the ESD circuit 110 to the bond pad 102 rather than at the center of the T-coil allows the wiring used to form the inductors to have relatively small cross-section, since an overvoltage discharge current that the ESD circuit is required to conduct does not flow through the inductors (as would be the case if the ESD circuit were instead conductively connected to the wiring trace 130 at the center of the T-coil). Here, the T-coil, needing not to carry the overvoltage discharge current, is designed to different criteria.

The T-coil including inductors 120, 140 is designed to compensate for lumped and distributed input gate capacitance Cg at node 134 looking into the chip. The input gate capacitance Cg includes the capacitance from all the gates of multiple circuits that are connected to node 134. This value Cg includes, for example, capacitance from circuits at the front end of the chip such as a signal detector, upchannel transmitter, automatic gain controlled (AGC) amplifier, among others. The input gate capacitance Cg also includes distributed capacitance looking into the chip from node 134, due to wiring 130 and other wiring to the circuits 132 of the chip. In addition to compensating for distributed capacitance, the design of the T-coil and the selection of the inductance values to be achieved by the inductors take into account the amount of distributed inductance and distributed resistance from the T-coil looking into the chip. The resistance Rwn represents a parasitic distributed resistance due to the wiring at the input to the chip.

As stated above, the connection of the ESD circuit directly to the bond pad 102 allows the inductors 120, 140 to be formed using smaller cross-section wiring, having less parasitic capacitance Cb (160) than if the ESD circuit were connected to the center of the T-coil. Smaller parasitic capacitance, in turn, causes the effective inductance of the T-coil to be larger. Another benefit of the ESD circuit 110 being connected to the pad 102 is that the inductors can have a greater number of turns within the same amount of chip area, given the thinner wiring used to form each inductor. These both lead to a T-coil having larger self-inductance and mutual inductance between the inductors 120, 140.

As further shown in FIG. 2, the ESD circuit 110 includes a first normally reverse-biased diode 112 having a cathode 113 conductively connected to the bond pad 102 and an anode 114 conductively connected to ground. The ESD circuit 110 also includes one or more second diodes 115 which are connected in an overvoltage discharge path to a power supply voltage source 118. The second diodes 115 are also normally reverse-biased in the path between the bond pad 102 and the power supply voltage source 118.

FIG. 3 illustrates a preferred physical embodiment 200 of the on-chip matching network in which a diode of the on-chip matching network is disposed in a triple well of a semiconductor region 202 of the substrate, i.e., the diode has a p-type anode disposed in a p-well region 212 of the semiconductor region 202, the p-well region 212 in turn being disposed in an n-type well region 214 that functions as the cathode of the diode 210, and the n-well region itself being disposed in the p-type bulk semiconductor region 216. The anode of the diode 210 is conductively connected through silicide contact region 228, via 230, wiring 232 and a further via 234 to the bond pad 102. Similarly, the cathode is conductively connected through silicide contact region 238, via 240 and wiring 242 to a source of fixed potential such as ground. The bulk semiconductor region 216 is heavily doped and is tied to ground, thus forming a ground plate. The p-well region 212 and the n-well region 214 have higher resistance than the bulk region 216 as a structure for avoiding latch-up. In addition, the reverse bias across the diode 210 in normal operation causes a depletion region 215 to arise at the junction between the p-well 212 and the n-well 214, and another depletion region 217 to arise at the junction between the n-well 214 and the bulk region 216. The presence of the depletion regions 215, 217 function as "depletion isolation regions" to help reduce capacitance between overlying structures and the semiconductor region 202. In addition, the structure preferably also includes one or more dummy diode structures 211 disposed in the semiconductor region 202, such dummy diode structures 211 having a structure within the semiconductor region which either matches or is similar to the diode 210, i.e., having a triple-well structure. Thus, the dummy diode structures function as "depletion isolation regions" in which a p-well 222 is disposed inside an n-well 224, and the n-well 224 in turn being disposed in the bulk region 216, there being a depletion region 225 at the junction between the p-well and another depletion region 227 at the junction between the n-well 224 and the bulk region 216.

As further shown in FIG. 3, wiring 220 which forms the turns of the inductors of the chip overlies the dummy diode structure 211. One of the portions of the inductor wiring 220 is conductively connected to the bond pad 102 through a via 221. Because of the depletion isolation regions of the dummy diode structure, wiring 220 from which the turns of the inductor are formed has reduced parasitic capacitance relative to the bulk region 216, such depletion regions providing isolation for the coiled inductor wiring 220 from the bulk semiconductor region 216.

Figure 4:
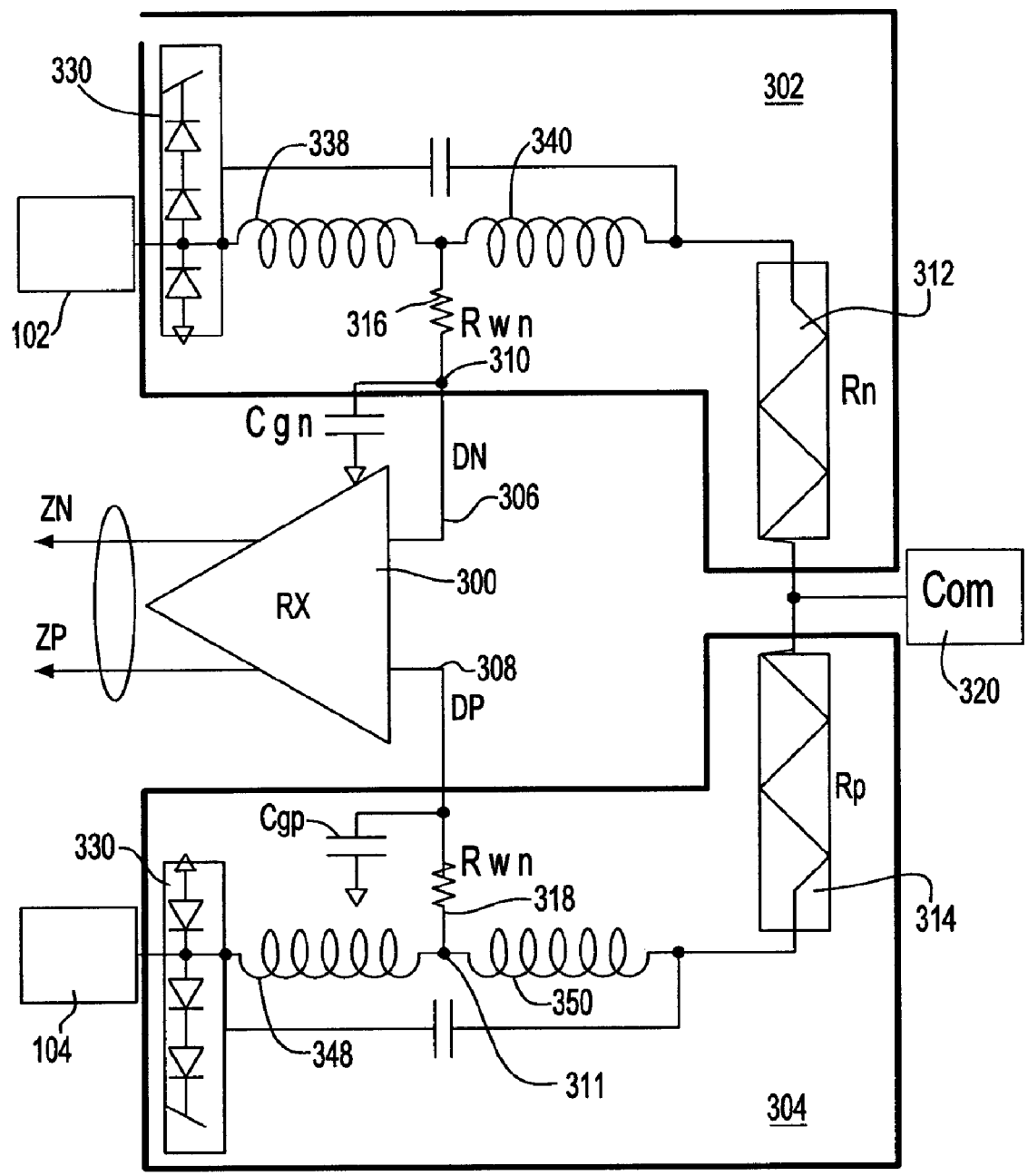
FIG. 4 is a circuit diagram illustrating interconnection of on-chip matching networks to a differential signal receiver of a chip according to a preferred embodiment of the invention.

FIG. 4 illustrates a further embodiment in which instances 302, 304 of the on-chip matching network 100 described above with reference to FIG. 2 are conductively connected between each of two bond pads 102, 104, respectively. Each instance 302, 304 is disposed underneath the respective bond pad 102, 104 of the chip. As is described more fully with reference to FIGS. 3 and 5 through 7 herein, further embodiments of the invention include ways in which good quality inductors are achieved in the on-chip matching networks 302, 304. The bond pads 102, 104 carry the differential input signals DN and DP, respectively, from the outside of the chip to the inputs 306 and 308 of a differential signal receiver 300 disposed within the chip. Termination resistors 312 and 314 of the on-chip matching networks 302, 304 are both connected to a common mode bias circuit 320 and regulated thereby. The termination resistors can include any type of on-chip resistor such as those formed of polysilicon, formed in a diffusion region within the semiconductor region 202 (FIG. 3), or formed of any suitable type of thin film. The value of the termination resistor 312 is selected such that the total equivalent series resistance between the bond pad 102 and the common mode bias circuit 320 becomes 50 ohms, taking into account the parasitic resistance of the two inductors 338, 340. For example, when the parasitic resistance of each inductor 338, 340 is 5 ohms, the value of termination resistor is set to 40 ohms so as to provide a total series resistance of 50 ohms. Likewise, the value of the termination resistor 314 is also selected such that the total series resistance between the other bond pad 104 and the common mode bias circuit 320 becomes 50 ohms, taking into account the parasitic resistance of the two inductors 348, 350.

A differential receiver circuit 300 of the chip is coupled to receive the differential signal inputs 306, 308 and output a pair of signals as outputs ZN and ZP. Each signal input 306, 308 is tied to the middle node 310, 311 of one of the matching networks through wiring traces 316 and 318, respectively, the wiring traces having parasitic resistance Rwn and Rwp. The differential signal input pins 306, 308 may also be connected to other devices such as a signal detector (not shown) or a JTAG specified receiver (not shown). Here, the input capacitance including the capacitance of devices at the input and distributed capacitance to the input pin 306 of the receiver 300 is lumped to a value Cgn and the input capacitance including the capacitance of devices at the input and distributed capacitance to the input pin 308 of the receiver 300 is lumped to a value Cgp. As in the embodiment described above with respect to FIG. 2, ESD circuits 330 each having one down-link diode to ground and two series-connected up-link diodes to the power supply are conductively connected to the bond pads 102, 104, respectively. The ESD circuits therefore provide overvoltage discharge protection between the respective bond pad 102, or 104 and ground and/or between the respective bond pad 102, 104 and a power supply.

Figure 5A:
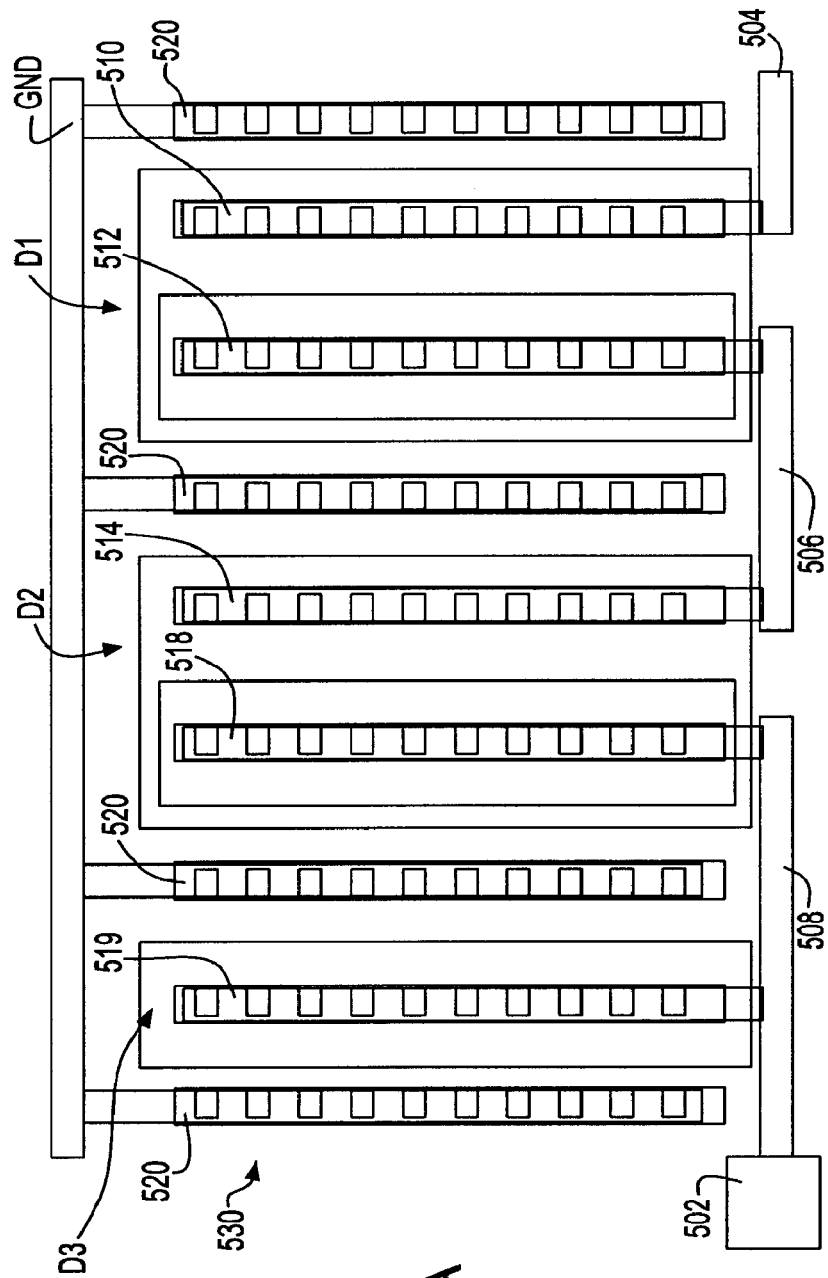
FIG. 5A is a top-down plan view illustrating an ESD circuit portion of an on-chip matching network according to an embodiment of the invention.
Figure 5B:
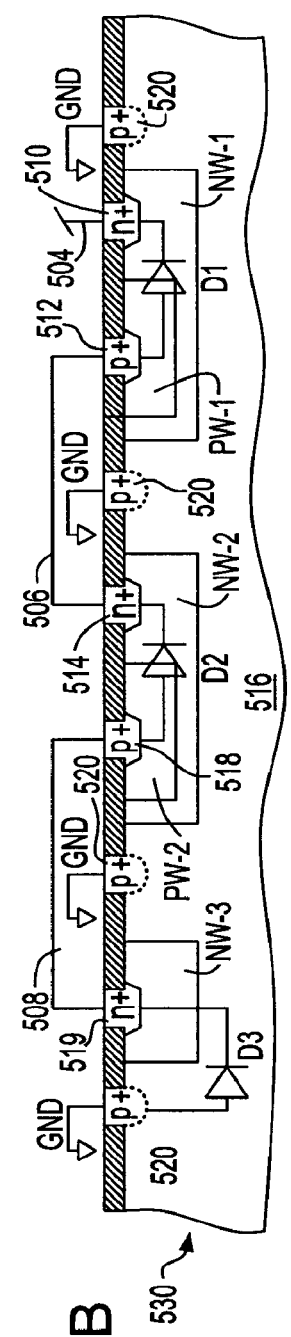
FIG. 5B is a sectional view corresponding to the plan view of FIG. 5A, illustrating structures of the ESD circuit provided in a semiconductor substrate.

FIG. 4 illustrates an arrangement in which on-chip matching networks 302, 304 provide improved inductance and reduced parasitic capacitance. However, to additional improvements are in the form of particular structures in the semiconductor region. FIG. 5A is a plan view and FIG. 5B is a corresponding sectional view of an ESD circuit 530 having two series connected up-link diodes D2 and D1 connected between an input pin 502 connected to a bonding pad of the chip and to a power supply through wiring 504. As shown in FIG. 5B, the up-link diodes are disposed in triple-well structures. Specifically, diode D1, having an n+ diffusion region 510 tied to the power supply through wiring 504 has a cathode disposed in an n-well (NW-1), and an anode disposed in a p-well (PW-1), the cathode having a p+ diffusion region 512 connected through wiring 506 to the n+ diffusion at the cathode of diode D2. Diode D2 is also disposed in a triple-well structure, having a cathode disposed in an n-well (NW-2) and an anode disposed in a p-well (PW-2). The cathode of diode D2 is connected through its n+ diffusion region 519 and through wiring 506 to the p+ diffusion region 512 at the anode of diode D1. The anode of diode D2, in turn, is connected through its p+ diffusion region 518 through wiring 508 to the input pin 502 of the chip. The cathode of diode D3, disposed in a third n-well (NW-3) is also connected through wiring 508 to the input pin 502 of the chip. As the anode of diode D1 is tied to ground, it is simply disposed in the bulk semiconductor region 516 of the substrate.

FIG. 5A is a corresponding top-down plan view of the diodes D1 through D2 and the interconnecting wiring. As discussed above with reference to FIG. 3, the depletion regions between the n-well of each diode and the p-well and the bulk region tend to reduce parasitic capacitance with respect to overlying structures.

Figure 6:
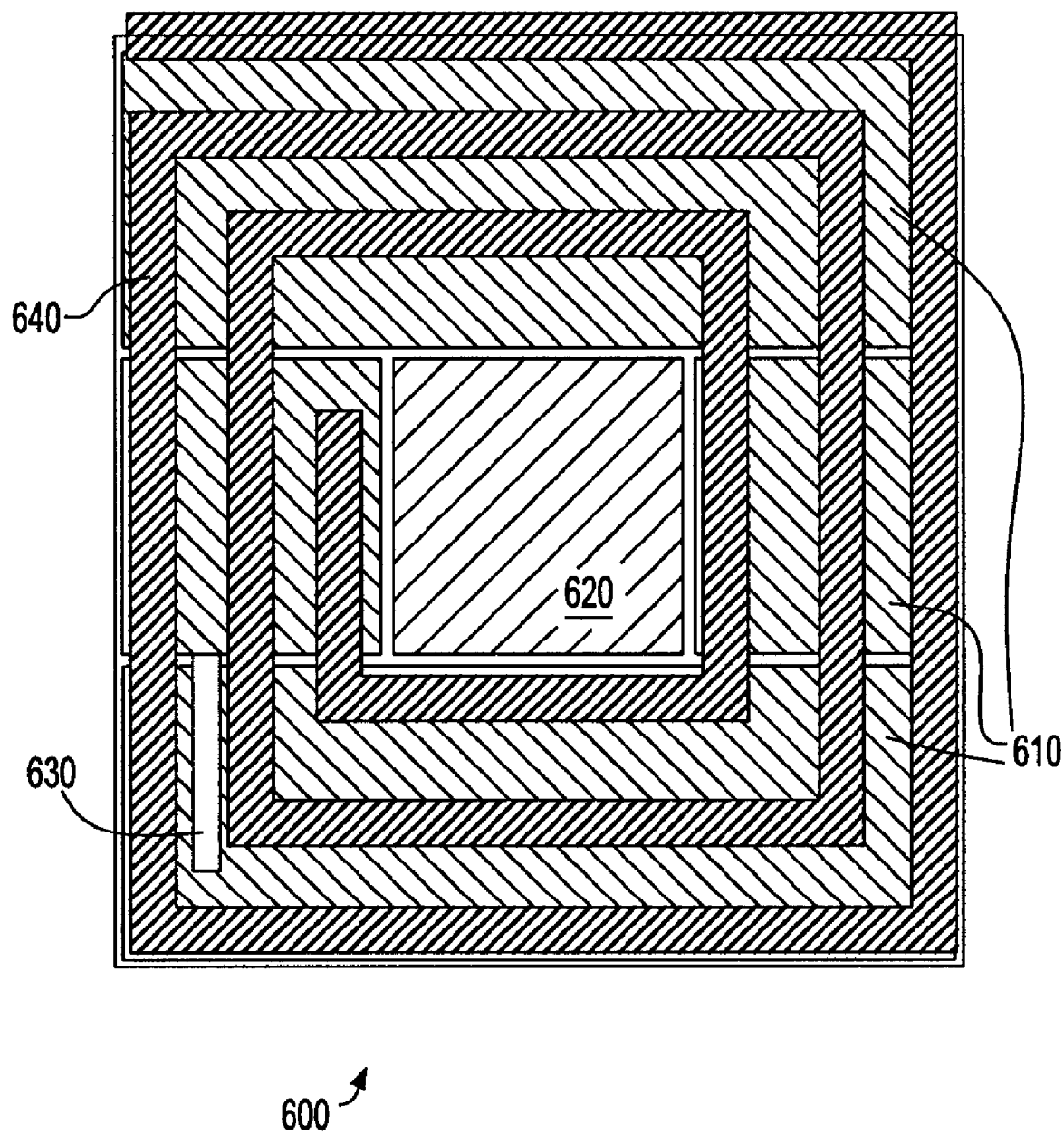
FIG. 6 is a top-down plan view illustrating a layout of an on-chip matching network according to an embodiment of the invention.

As best seen in the top-down plan view of FIG. 6, the diodes D1 through D3 are preferably all located in a central ESD region 620 of the portion of the semiconductor region 600 that underlies the center of the bond pad. As mentioned above, and further apparent from FIG. 6, the direct conductive connection between the ESD region 620 and the pad allows the wiring of the inductors to be sized for the purposes of achieving a desirable inductance, rather than having to carry the maximum ESD discharge current through the inductor.

Additional dummy diode structures 610 having structures similar to those of diodes D1 through D3 are also preferably disposed underneath the remaining area of the pad for the purpose of reducing the amount of coupling loss relative to the substrate. Two spiral conductors of on-chip inductors overlie the dummy diode structures 610, of which only one conductor 640 is shown in FIG. 6, for ease of illustration. The placement of the on-chip inductor overlying the dummy diode structures reduces the parasitic capacitance, due to the presence of the depletion regions which act to isolate the respective well regions of the dummy diode structures from the bulk region of the substrate. As further shown in FIG. 6, the termination resistor is preferably provided as a thin film resistor 630 overlying the dummy diode structures.

Figure 7:
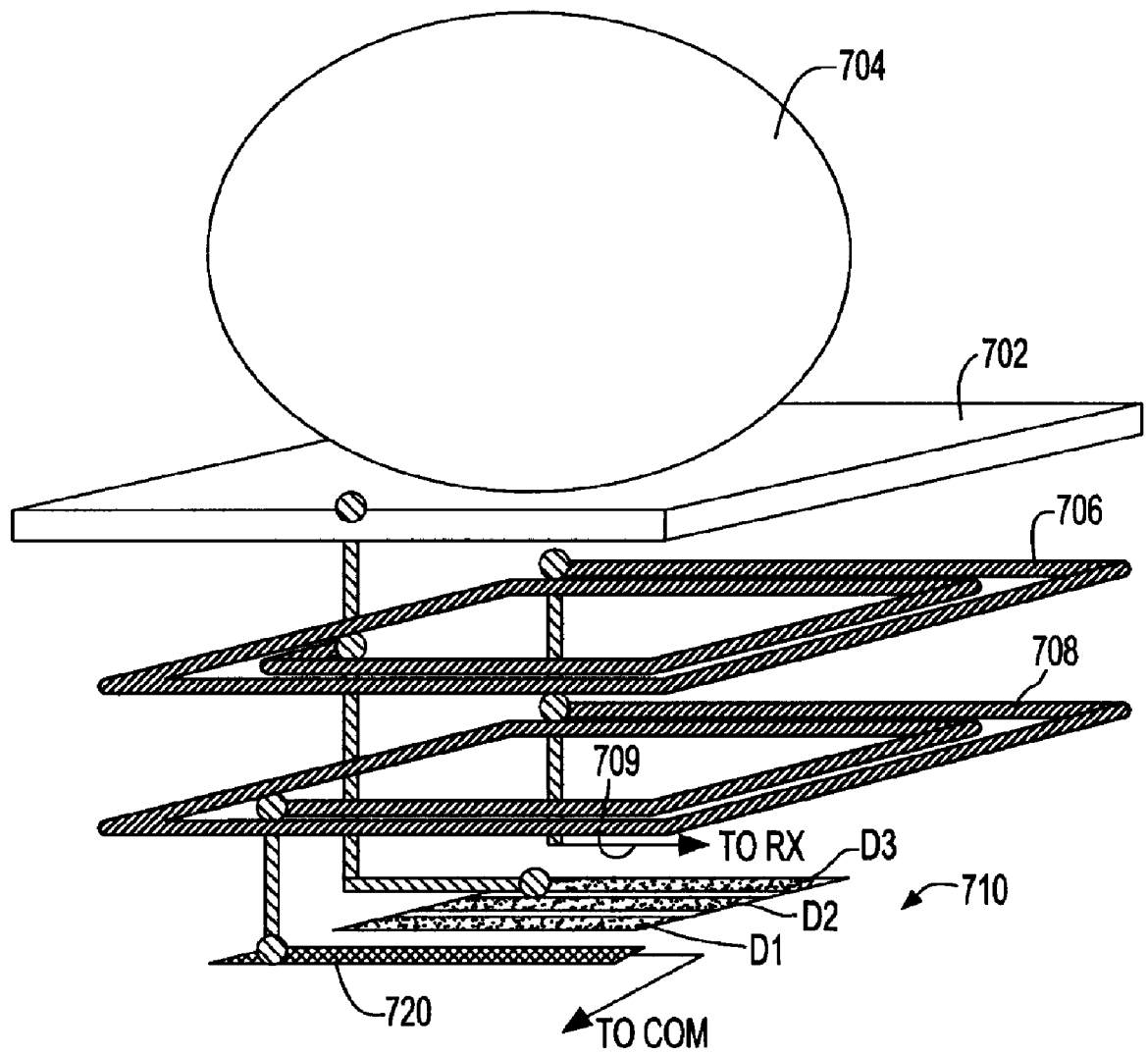
FIG. 7 is a three-dimensional perspective view illustrating an on-chip matching network according to an embodiment of the invention.
Figure 8:
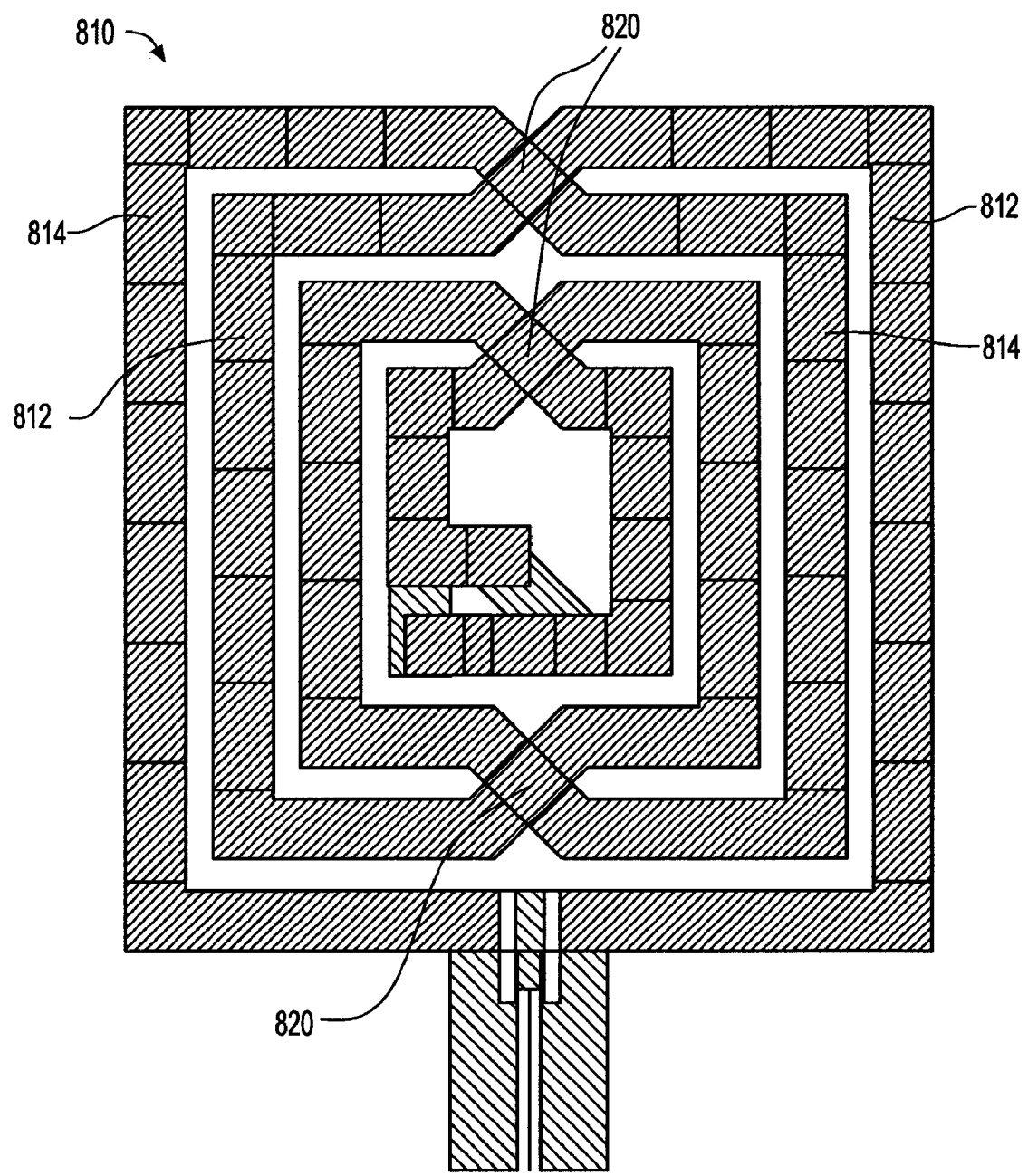
FIG. 8 is a top-down plan view illustrating an under-pad structure of the two inductors of the T-coil of an on-chip matching network according to an embodiment of the invention.
Figure 9:
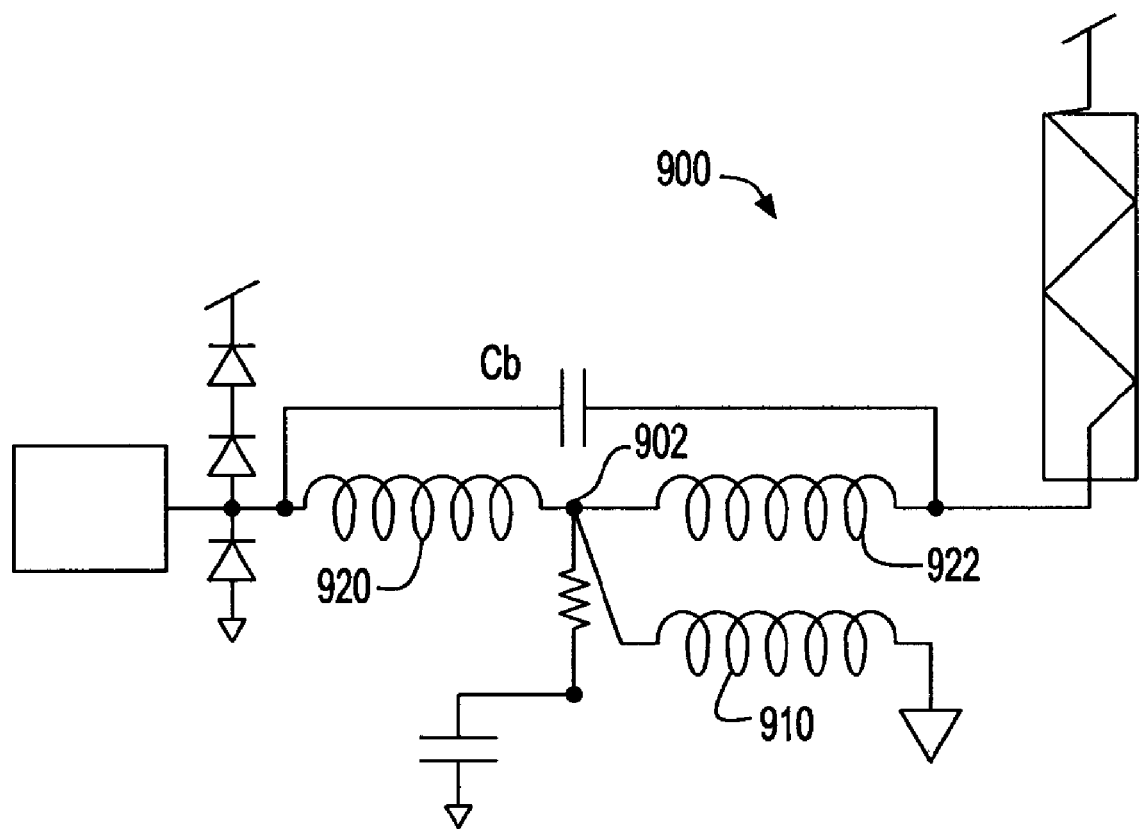
FIG. 9 is a circuit diagram of on-chip matching network further including a third inductor, according to another embodiment of the invention.

FIG. 7 further provides a three-dimensional perspective view of the on-chip matching network and its connection to the pad 702. The pad 702 makes external connection to a package through a solder bump connection, e.g., through a C4 type solder bump 704. The inductors 706 and 708 are constructed of higher back-end-of-the-line (BEOL) metal layers, and are disposed over dummy diode structures having structures similar to those of the diodes used in the ESD circuit 710, the inductors 706, 708 being connected to an input of a differential signal receiver (RX) through wiring 709. Diodes D1, D2 and D3 of the ESD circuit are shown in FIG. 7, as is the thin film termination resistor 720, connected through wiring 722 at one end to a common mode bias circuit (COM). Finally, FIG. 8 is a top-down plan view illustrating an under-pad structure of the two inductors of the T-coil. Here, each inductor 812, 814 occupies half of each conductive ring of the inductor. The inductors partially overlap each other at crossover points 820 of the T-coil 810. With the inductors of the T-coil placed in close proximity to each other and partially overlapping each other, there is both parasitic coupling capacitance and mutual inductance between them. While the benefit to mutual inductance of placing the inductors in close proximity significantly outweighs the parasitic capacitance, it is still desirable to compensate the parasitic capacitance of the T-coil. Accordingly, for this purpose, FIG. 9 illustrates an embodiment of an on-chip matching network in which the T-coil 900 includes a third inductor 910 having one terminal connected to the center node 902 of the T-coil 900, and the other terminal connected to ground. The third inductor 910 is able to adequately compensate for the coupling capacitance Cb resulting from the proximity of the two main inductors 920, 922 of the T-coil. In a preferred embodiment, the third coil need only be one-third to one-half the size of each main inductor 920 or 922, and can be placed at a location which is either not underneath the bond pad of the chip, completely underlying the bond pad, or only partially underlying the bond pad, as needed to achieve the required inductance. For example, in one embodiment, the third inductor 910 can be disposed completely under a pad area defined by the bond pad, but outside of the area occupied by the two main inductors 920, 922 of the matching network 920, 922. In a particular embodiment, the third inductor 910 includes one or more spiral turns of an additional conductor under the area of the bond pad but outside the area of the two main inductors 920, 922, the third inductor overlying a depletion isolation region of the substrate, in a manner as described above with reference to FIG. 3.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A chip, comprising:
   a bond pad;
   at least one common node;
   an on-chip matching network having a first terminal conductively connected to said bond pad and a second terminal conductively connected to said common node;
   a wiring trace connecting said on-chip matching network to a circuit of said chip;
   said on-chip matching network including:
      an electrostatic discharge protection (ESD) circuit having at least one diode having a first terminal conductively connected to said bond pad and a second terminal connected in an overvoltage discharge path to a source of fixed potential;
      a first inductor coupled to provide a first inductive path between said bond pad and said wiring trace;
      a termination resistor having a first terminal connected to said common node;
      a second inductor coupled to provide a second inductive path between said wiring trace and a second terminal of said termination resistor; and
      a first well having a p-type conductivity and a depletion isolation region overlying said first well, wherein said first and second inductors include first and second overlapping spiral conductors having mutual inductance, said first and second conductors overlying said depletion isolation region.

2. The chip as claimed in claim 1, wherein said at least one diode has a cathode conductively connected to said bond pad and an anode conductively connected to ground.

3. The chip as claimed in claim 1, wherein said electrostatic discharge protection circuit includes a second diode having an anode connected to said bond pad and a cathode connected in an overvoltage discharge path to a voltage source.

4. The chip as claimed in claim 1, wherein said first well is heavily doped to provide a conduction path to ground, said chip further including a second well having an n-type conductivity disposed within said first well, and a third well having p-type conductivity disposed within said second well, wherein a cathode of said at least one diode is disposed in said second well and an anode of said at least one diode is disposed in said third well.

5. The chip as claimed in claim 4, wherein said depletion isolation region includes a fourth well having an n-type conductivity disposed within said first well, and a fifth well having p-type conductivity disposed within said fourth well, said fourth and fifth wells defining a dummy diode electrically separate from said at least one diode provided in said second and third wells.

6. The chip as claimed in claim 1, wherein said circuit connected to said wiring trace includes a differential signal receiver, said on-chip matching network is a first on-chip matching network, said bond pad is a first bond pad and said wiring trace is a first wiring trace connecting said first on-chip matching network to a first input terminal of said differential signal receiver, said chip further including a second bond pad, a second said on-chip matching network having a first terminal conductively connected to said second bond pad, a second terminal conductively connected to said common node, and a second wiring trace connecting said second on-chip matching network to a second input terminal of said differential signal receiver.

7. The chip as claimed in claim 1, wherein said on-chip matching network further includes a third inductor, said third inductor adapted to compensate for a coupling capacitance between said first and second inductors.

8. The chip as claimed in claim 7, wherein said bond pad defines a pad area and said third inductor is disposed completely under said pad area.

9. The chip as claimed in claim 7, wherein said bond pad defines a pad area and said third inductor is not disposed completely under said pad area.

10. The chip as claimed in claim 1, wherein said first and second inductors and said electrostatic discharge protection circuit are disposed at least partially under said pad area.

11. The chip as claimed in claim 1, wherein said bond pad defines a pad area of said chip and said on-chip matching network is disposed completely under said pad area and is bounded by said pad area.

12. The chip as claimed in claim 1, wherein said first and second inductors are not connected in primary paths for conducting electrostatic discharge currents through said ESD circuit.

13. A chip, comprising:
   a bond pad;
   an on-chip matching network including a semiconductor region of a substrate and a wiring region of said substrate disposed above said semiconductor region;
   a wiring trace connecting said on-chip matching network to a circuit of said chip, said wiring trace provided in said wiring region;
   said on-chip matching network including:
      an electrostatic discharge protection (ESD) circuit having at least one diode disposed in said semiconductor region, said at least one diode having a first low impedance connection to said bond pad and a second low impedance connection to a common node;
   a termination resistor coupled to said common node to provide a resistive path for current to and from said common node;
   a first inductor disposed in said wiring region, said first inductor connected to said bond pad and said wiring trace to provide an inductive path between said bond pad and said wiring trace; and
   a second inductor disposed in said wiring region, connected to said wiring trace and to said termination resistor at a location other than said common node to provide an inductive path between said wiring trace and said termination resistor, wherein said first and second inductors include first and second overlapping spiral conductors having mutual inductance, wherein said semiconductor region further includes at least a first depletion isolation region disposed between said first spiral conductor and said first well and a second depletion isolation region disposed between said second spiral conductor and said first well.

14. The chip as claimed in claim 13, wherein said at least one diode has a cathode conductively connected to said bond pad and an anode conductively connected to ground.

15. The chip as claimed in claim 13, wherein said electrostatic discharge protection circuit includes a second diode having an anode connected to said bond pad and a cathode connected in an overvoltage discharge path to a voltage source.

16. The chip as claimed in claim 13, wherein said on-chip matching network further includes a third inductor, said third inductor adapted to compensate for a coupling capacitance between said first and second inductors.

17. The chip as claimed in claim 16, wherein said third inductor does not overlap said first inductor and does not overlap said second inductor.

* * * * *